(12) United States Patent
Kortesluoma et al.

(10) Patent No.: US 10,728,726 B2
(45) Date of Patent: Jul. 28, 2020

(54) SAMPLED MEASUREMENT DATA STREAM CONTROL

(71) Applicant: ABB Schweiz AG, Baden (CH)

(72) Inventors: Markus Kortesluoma, Tampere (FI); Frej Suomi, Vaasa (FI)

(73) Assignee: ABB Schweiz AG, Baden (CH)

( * ) Notice: Subject to any disclaimer, the term of this patent is extended or adjusted under 35 U.S.C. 154(b) by 560 days.

(21) Appl. No.: 15/526,930

(22) PCT Filed: Nov. 13, 2014

(86) PCT No.: PCT/EP2014/074445
§ 371 (c)(1),
(2) Date: May 15, 2017

(87) PCT Pub. No.: WO2016/074721
PCT Pub. Date: May 19, 2016

(65) Prior Publication Data
US 2017/0343587 A1     Nov. 30, 2017

(51) Int. Cl.
*G01R 27/02* (2006.01)
*H04L 29/04* (2006.01)
(Continued)

(52) U.S. Cl.
CPC .......... *H04W 4/70* (2018.02); *G01R 19/0046* (2013.01); *H02H 7/261* (2013.01); *H04L 67/12* (2013.01); *H04L 67/125* (2013.01); *Y04S 40/18* (2018.05)

(58) Field of Classification Search
CPC . G01R 19/0046; G01R 19/2513; H04L 67/12; H04L 67/125; H04L 67/02;
(Continued)

(56) References Cited

U.S. PATENT DOCUMENTS 9,048,697 B2 * 6/2015 Wang ................. H02H 7/261
2012/0215479 A1 * 8/2012 Pamulaparthy ..... H04L 43/0864
702/122
(Continued)

FOREIGN PATENT DOCUMENTS

WO     2011121386 A1     10/2011

OTHER PUBLICATIONS

International Search Report and Written Opinion, Patent Application No. PCT/EP2014/074445, dated May 19, 2016, 9 Pages.
(Continued)

*Primary Examiner* — Minh N Tang
(74) *Attorney, Agent, or Firm* — Taft Stettinius & Hollister LLP; J. Bruce Schelkopf

(57) ABSTRACT

Sampled measurement data stream is controlled in an electrical network by measuring at least one measurement value in a remote device; detecting in the remote device at least one phenomenon of interest or request for a connection from the central device; activating by the remote device a communication channel for sampled measured values between the remote device and a central device in response to the detection of the phenomenon of interest or the request for a connection from the central device; and sending the measurement value from the remote device to the central device through the communication channel for sampled measured values.

21 Claims, 3 Drawing Sheets

(51) Int. Cl.
*H04W 4/70* (2018.01)
*H02H 7/26* (2006.01)
*H04L 29/08* (2006.01)
*G01R 19/00* (2006.01)

(58) Field of Classification Search
CPC ......... H04L 67/025; H04L 67/26; H04L 1/08;
H04L 1/189; H04W 4/20; H04W 4/38;
H04W 4/70; H02H 7/261
See application file for complete search history.

(56) References Cited

U.S. PATENT DOCUMENTS

| | | |
|---|---|---|
| 2013/0205022 A1 | 8/2013 | Kagan et al. |
| 2014/0280712 A1 | 9/2014 | Dolezilek et al. |
| 2014/0282021 A1* | 9/2014 | Dolezilek ............... H04L 41/22 715/735 |

OTHER PUBLICATIONS

International Preliminary Report on Patentability, Patent Application No. PCT/EP2014/074445, dated Feb. 13, 2017, 30 pages.

* cited by examiner

SAMPLED MEASUREMENT DATA STREAM CONTROL

BACKGROUND

The invention relates to sampled measurement data stream control, and particularly to a remote device and a system for an electrical network and a method for controlling sampled measurement data stream in an electrical network.

An electrical network is typically a very large entity comprising a very large number of measurement devices monitoring the state of the electrical network and trying to detect faults and deviations. Over time, large number of these faults and deviations occur in different parts of the electrical network and a very large number of devices detect these faults over a long period of time.

It also follows that in an electrical network, a specific fault is typically detected by several devices at the same time. This might be because a fault occurs in several locations at the same time, but more typically this is caused by several devices reacting to the same fault. These might be the devices of the same area or even devices from subsequent areas that react to the fault even though it doesn't actually happen inside their own area. This causes a multiplied amount of information to be transferred over the communication network 6 between the devices.

It is usual that most of the central supervision and control systems requiring measurement values from several different locations mostly use physical wiring. This means excessive amount of wiring if several locations are connected and creates high costs. Bus communication has been introduced to reduce the need for wiring, but the bus communication often ends up being a bottle neck resource due to the large amount of sampled measure values (or sampled measured values as referred to in IEC61850) that need to be sent from a plurality of senders simultaneously.

US 2014280712 discloses systems and methods for exchanging messages between devices in an electrical power generation and delivery system, and particularly transmitting messages included in a message stream that includes multiple redundant copies of the messages, and receiving an indication to confirm that at least one message of the message stream was received by an intended receiving device. US 2013205022 discloses a system and a method for energy management reporting, analysis, and billing system, wherein parameters of a commodity consumed at a customer location are measured with meters and the measured parameters are transmitted to a server in communication with the one or more meters by way of a communication network, whereby the server may be configured to receive the measured parameters from the one or more meters and store the parameters as log data. WO 2011121386 discloses a method for coordinated transfer of control in a substation system comprising IED or logical devices/servers using GOOSE messages with preconfigured data models with logical nodes containing one or more data objects including private data objects connected in the substation communication network, whereby an operation is handed over from one device of a hot-standby pair to the other, if the first device fails.

It is known to store information about a fault in a remote device of an electrical network when a fault is detected, inform central monitoring station or similar about the fault and then read the data from one or several remote devices to the central monitoring station at a suitable moment of time. However, information is then always got only after the incident and typically very late considering solving the problem.

BRIEF DESCRIPTION

The object of the invention is to provide a new and improved remote device and system in an electrical network and a method for controlling sampled measurement data stream. The objects of the invention are achieved by a method and an arrangement which are characterized by what is stated in the independent claims. Some preferred embodiments of the invention are disclosed in the dependent claims.

The invention is based on the idea of activating by a remote device a communication channel for sampled measured values between the remote device and a central device in response to the detection of a phenomenon of interest or the request for a connection from the central device.

An advantage of the solution is that a quick communication connection may be established between a central device and a plurality of remote devices only when needed for communicating a phenomenon of interest and data related to it without continuously loading the communication channels.

BRIEF DESCRIPTION OF THE DRAWINGS

In the following the invention will be described in greater detail by means of preferred embodiments with reference to the accompanying drawings, in which.

DETAILED DESCRIPTION

Figure 1:
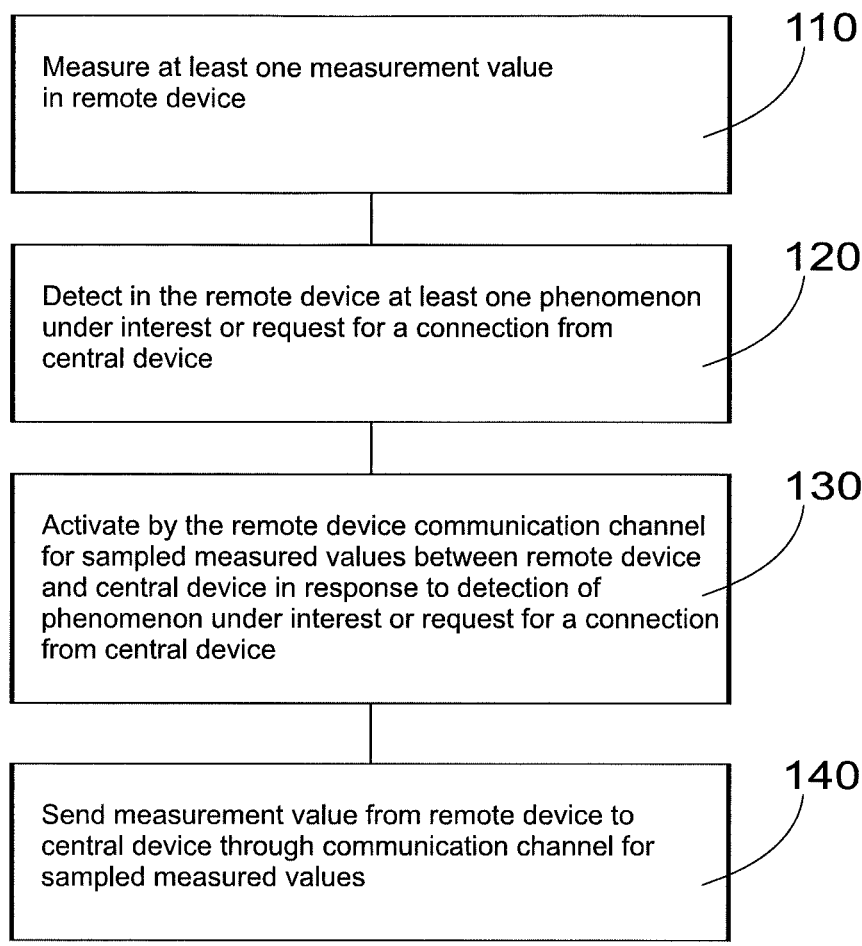
FIG. 1 shows a method for controlling sampled measurement data stream in an electrical network.

FIG. 1 shows a method for controlling sampled measurement data stream in an electrical network. Such an electrical network 1 may comprise at least one central device 3 and at least one remote device 2. A central device 3 may comprise high performance protective relay or a more powerful control device, such as an industrial computer. In some embodiments, there may be several central devices 3 in the electrical network. These central devices may be parallel to one another, in other words each of the central devices controls a separate set of remote devices. Two or more of the central devices may also be in some embodiments arranged to control at least partly the same remote devices for better reliability. According to a further embodiment, there may be a hierarchy between the central devices, in other words at least one of the central devices may be configured to control at least one of the other central devices.

A remote device 2 may comprise any device in an electrical network that measures and/or transfers signals in the electrical network or in different devices of the electrical network. Such signals may comprise but are not limited to at least one of the following: current, voltage, temperature, pressure and state data. According to an embodiment, the remote device may also carry out local measurement, calculation/computing and/or analysis based on local measurements. According to a further embodiment, the remote device may be arranged to protect a local object based on local measurements. The remote device(s) may be located geographically far apart from one another and/or the central device or on a common geographical site, as long as the communication described in this description may be arranged between them. Some embodiments are described in more detail further along the description.

According to an embodiment, the remote device may comprise an electronic device of an electrical network, such as a protective relay. According to another embodiment, the remote device may comprise a device of an electrical network that only measures and stores measurement data. Such a device may comprise an energy meter or a so called merging unit for measuring currents/voltages.

Figure 2:
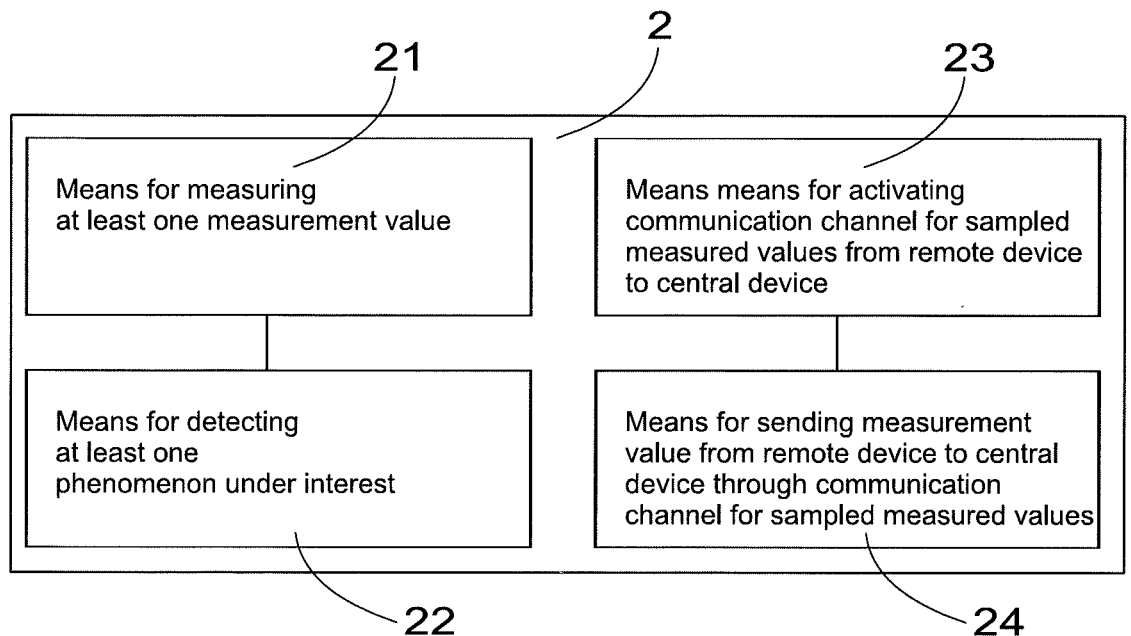
FIG. 2 illustrates schematically a remote device for an electrical network.

In the method of FIG. 1 and in the remote device of FIG. 2, the remote device may, in addition to and/or as part of its normal local functions some examples of which are described above, be arranged to measure 110 at least one measurement value in the remote device. The remote device may further be arranged to detect 120 at least one phenomenon of interest in the remote device. Such a phenomenon of interest may be a phenomenon detectable in the network that indicates a potential deviation in the operation of the network or the remote device, such as overcurrent, earth fault or the like. In other words, the phenomenon of interest may be any action, incident or a deviation measured or detected in another manner in the electrical network that requires either more advanced control activities than those provided by the remote device alone or attention of an operator, for example. The detection of such phenomenon may be based on deviations in signals measured by the remote devices or predefined events of interest, for example. These deviations may be related to for instance the measurement value crossing a control limit, an unusual or unfavourable trend of the measurement value or the like.

In the method of FIG. 1 and in the remote device of FIG. 2, the remote device may be arranged to activate 130 a 9-2LE or 9-2 communication channel or other communication channel for sampled measured values between the remote device and the central device. In this description, such channels are referred to as communication channel for sampled measured values. As 9-2LE and 9-2 are used as examples throughout the description, the method, device and system also apply for other types of sampled measured values.

9-2LE and 9-2 are methods according to standard IEC 61850 for transferring, in other words sending and/or receiving, currents and voltages as sampled values. Typically, such a sample stream comprises either 80 samples per a cycle of the signal of the electrical network (80 s/c), which in a 50 Hz electrical network corresponds to a 4 kHz sampling rate. However, the solution also applies for other sampling frequencies as well and is not limited to 80 samples per cycle. Thus, the sample stream may also comprise other sampling frequencies, such as 200 samples per cycle corresponding to sampling stream of a 10 kHz sampling rate, for example. If needed, both remote device(s) and the central device(s) may be provided with FPGA transferring restart feature for a faster start of the 9-2LE or 9-2 sending and receiving. Restarting transferring in the FPGA may then be used to control starting and/or stopping sending and/or receiving the 9-2LE or 9-2 values.

A sample stream of this kind of a sampling rate, in other words sampling frequency, comprising, as is typically the case, several current and voltage measurements from each object would load the communication network very much. To limit the load on the communication network caused by the transfer of less relevant information, in the method of FIG. 1 and the remote device of FIG. 2, the activation may only take place under predetermined circumstances, in other words in response to the detection in the remote device of a phenomenon of interest or requested a request for a connection from the central device.

According to an embodiment, the commands needed for activating the communication channel for sampled measured values between the remote device and the central device may be provided using 8-1 GOOSE messages based on standard IEC 61850. The benefit of this embodiment is that the 8-1 GOOSE messages are very fast, delivering the commands in less than 3 ms, for example, which together with a quick opening of the communication channel enables the required speed for starting the sample data transfer that is essential for many applications, such as fault detection and fault location. Similarly, according to an embodiment, GOOSE messages may also be used for suppression of not needed 9-2LE or 9-2 measurement values from remote devices by commanding stopping of sending the data from the remote device(s) to the central device. Preferably, this may be done in response to end results accomplished in the central device, whereby no more measurements are needed.

Thus, once the communication channel for sampled measured values is activated between the remote device and the central device, the measurement value or values from the remote device may be sent 140 to the central device through the communication channel for sampled measured values. According to an embodiment, the measurement values to be sent, the receiving address of the central device and triggering conditions, in other words characteristics for identifying the phenomena of interest, have been predetermined.

FIG. 2 illustrates schematically a remote device for an electrical network. Such a remote device 2 may thus comprise means for measuring at least one measurement value 21, means for detecting at least one phenomenon of interest 22, means for activating a communication channel for sampled measured values from the remote device to a central device 23 in response to the detection of the phenomenon of interest and means for sending the measurement value from the remote device to the central device through the communication channel for sampled measured values 24.

According to an embodiment, the network may comprise two remote devices 2. According to other embodiments, the network may comprise several, dozens or hundreds of remote devices.

It is usual in an electrical network that several remote devices detect a phenomenon of interest at the same time. This might in rare cases be caused by several phenomena of interest taking place at the same time, but more usually this is caused by several remote devices of one area or subsequent areas detecting the same phenomenon of interest. In such cases, it is not always efficient to activate communication channel for sampled measured values between each one of these remote devices and the central device.

According to an embodiment, two or more remote devices, preferably all the remote devices of an area, are configured to use GOOSE communication between the remote devices to select the at least one remote device to activate the communication channel for sampled measured values between the remote device and the central device, when several remote devices detect an phenomenon of interest at the same time. In some cases, sample data from one remote device might be sufficient, while in some other cases sample data from several remote devices might be needed. Selection logic functionality may, thus, be configured between the remote devices. In such embodiments, GOOSE communication may be used for high-speed communication delivering information needed by the selection logic between the remote devices. According to another embodiment, the central device may be configured to select the remote devices to activate the communication channels for sampled measured values to the central device, when several remote devices detect a phenomenon of interest at the same time. In other words, the at least one remote device to activate the communication channels for sampled measured values to the central device may be selected in the central device in response to more than one remote device of the electrical network detecting a phenomenon of interest at the same time. In such an embodiment, GOOSE messages may be used for high-speed communication delivering information needed by the selection logic between the remote devices and the central device.

The remote device(s) and the central device may be located at the same geographical location, the central device may located geographically far from the remote device(s) and/or the remote devices and the central device may be located geographically far from one another. According to an embodiment, the central device and the remote device(s) are located on the same substation of the electrical network. According to another embodiment, the central device may be located at a network control center of an electric company and the remote devices may be consumer energy meters located at the consumers' houses, for example. These are some examples only and any distance between the central device and/or the remote devices or a combination of remote devices or remote device groups located at different locations is possible within the solution described in this description, as long as the described connections and data transferring capacities can be provided. In other words, communication connections that are constantly open or can be opened very quickly and that are able to quickly transfer a large amount of data are needed. An always open Ethernet connection or an Ethernet connection that can be opened very quickly may be used, for example.

Figure 3:
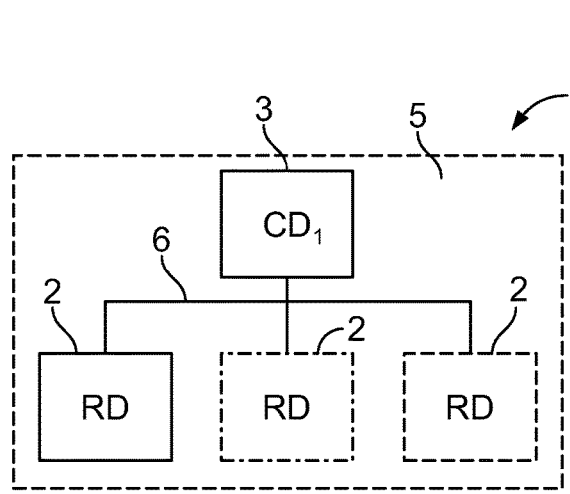
FIG. 3 illustrates schematically a system in an electrical network.

FIG. 3 illustrates schematically a system 1 in an electrical network or, in other words, a part of an electrical network. The part comprises three remote devices 2 and a first central device 3 all located within the same substation 5. The remote devices 2 and the first central device 3 are connected by a fast Ethernet communication network 6. The remote devices 2 comprise three different types of protective relays. The substation 5 may be arranged to feed electricity to a local electrical network. Thus, the solution of FIG. 3 may aimed at fault location or detection and location of other such phenomena of interest in said local electrical network and the method and the remote device functionalities described in this description may be implemented in the local network.

Figure 4:
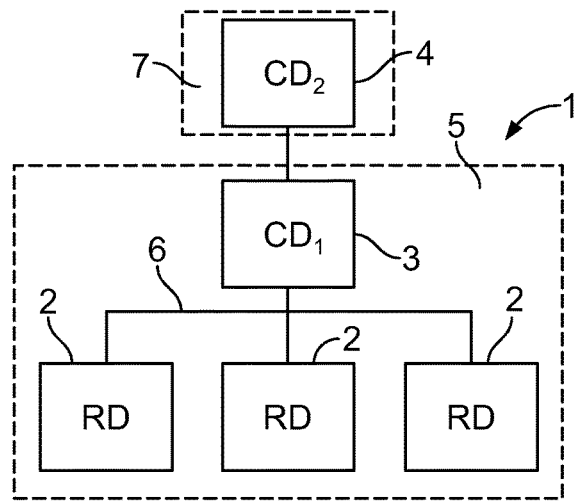
FIG. 4 illustrates schematically a second system in an electrical network.
Figure 5:
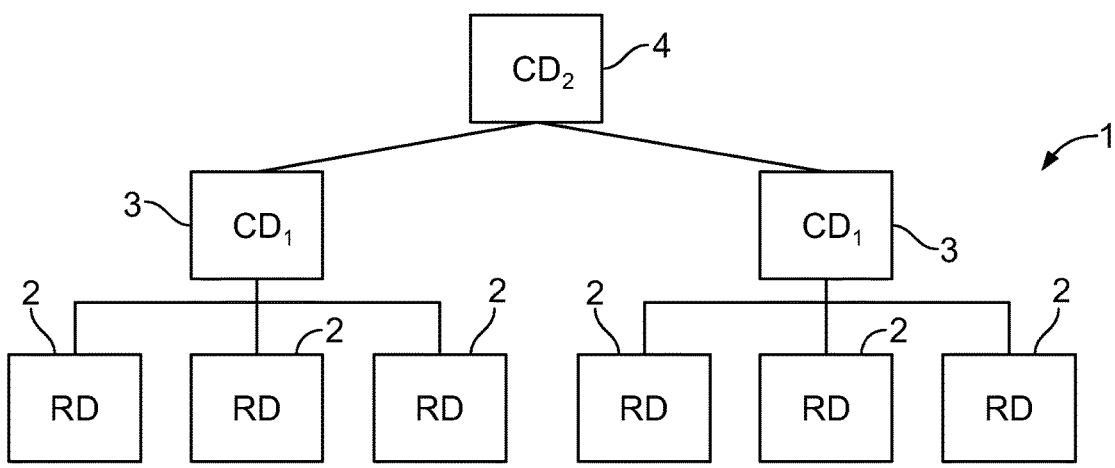
FIG. 5 illustrates schematically a third system in an electrical network.

In the embodiment of FIG. 4, illustrating schematically a second system 1 in an electrical network, also a second central device 4 located in a central location 7, such as in a network control center of a larger electrical network entity or in a network control center of an electric company, is shown. This second central device may be arranged to control a larger entity of an electrical network or even the whole network directly or through first central devices of local electrical networks according to the principles explained in connection with remote devices and central devices, for example, provided that the described communication channels may be provided. A simplified example of such a system 1 is described in FIG. 5 illustrating schematically a third system 1 in an electrical network. According to another embodiment, the detection and location of fault or another phenomenon of interest may be done in the first central device and the first central device may be configured to send information about the fault or other phenomenon of interest to the second central device always or when predetermined conditions are met.

Figure 6:
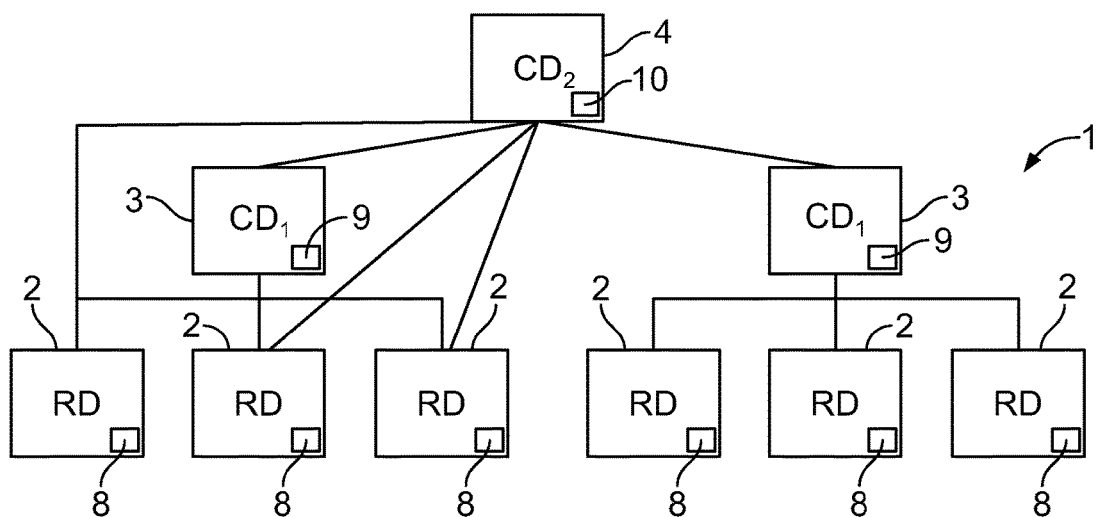
FIG. 6 illustrates schematically a fourth system in an electrical network.

FIG. 6 illustrates schematically a fourth system 1 in an electrical network. The electrical network comprises several substations. The communication connections to each one of the substations may be the same or better communication connections may be provided for some substations than some others. Depending on the quality, in other words capacity and speed of opening the communication channels, for example, several different embodiments of the method and the remote device may be applied.

Figure 7:
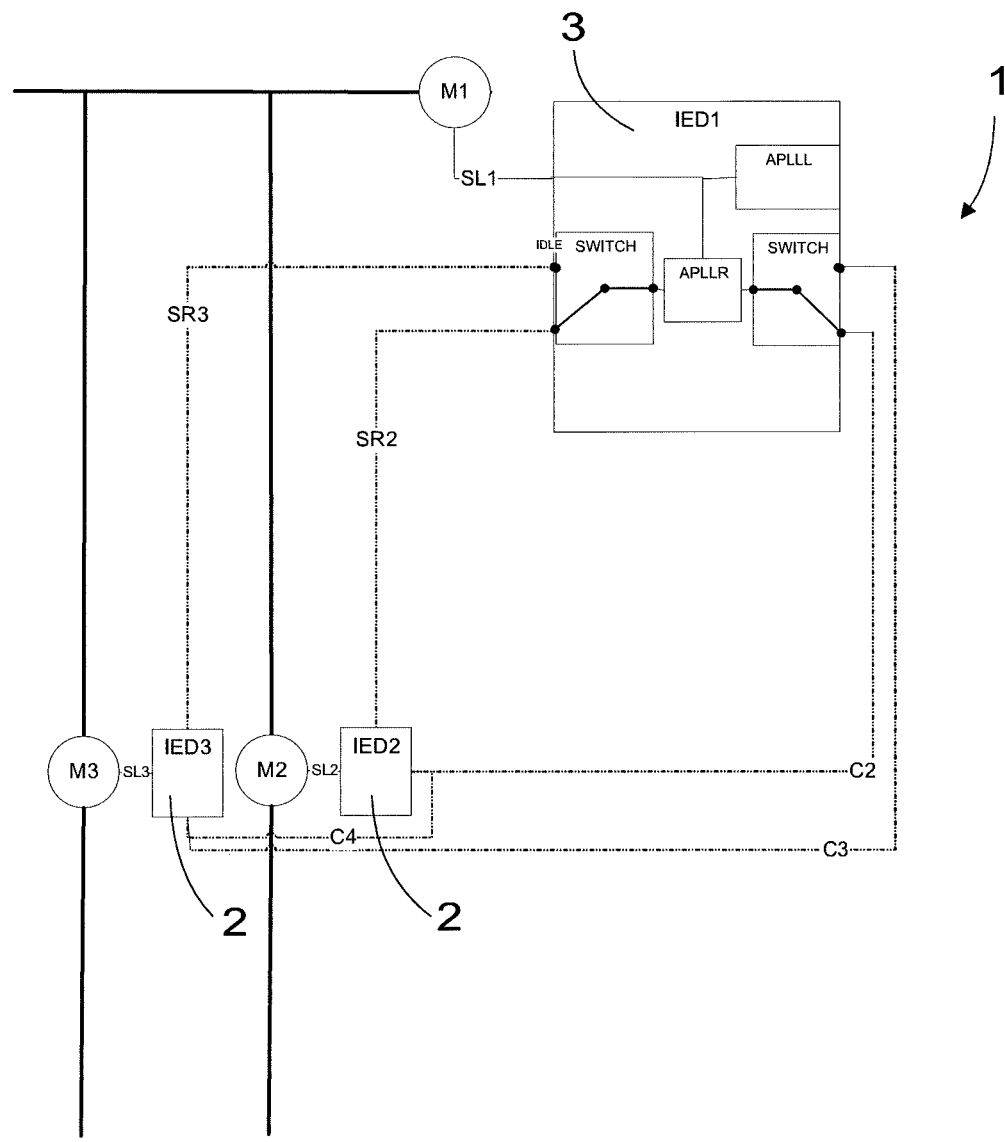
FIG. 7 illustrates schematically a fifth system in an electrical network.

FIG. 7 illustrates schematically a fifth embodiment in an electrical network with only two remote devices 2 shown and especially an example of connections between the remote devices 2 and the central device 3. The central device 3 (IED1 in FIG. 7) may thus be connected to several devices of the electrical network, such as remote devices 2 (IED2 and IED3 in FIG. 7), preferably by a fast communication network. Only two remote devices are shown in FIG. 7, but as stated above, the solution is scalable and the configuration of the system 1 in an electrical network may vary heavily depending on the embodiment. The remote devices 2 may, for instance, measure signals detected by the electrical network and/or devices of the electrical network, such as currents, voltages, temperatures, pressures, different types of levels and states and so on, and/or execute measurements, calculations and/or analysis operations.

According to one embodiment, the detection and location of phenomena of interest may be provided within each substation as described for at least one remote device and a central device above. Thus, the first central device would serve as the central device and only the first central device would only send information about a detected phenomenon to the second central device. This is beneficial especially if the communication connection between the first central device or the remote device and the second central device is not fast enough for the second central device to act as the central device described in connection with the method.

According to another embodiment, the first central device of each substation may store the 9-2LE or 9-2 sample stream received from the remote device(s) described in this description, and particularly in connection with FIG. 2, according to the method described in this description, and particularly in connection with FIG. 1, in the memory 9 of the first central device 3. This stored 9-2LE or 9-2 sample stream data may then be read to the memory 10 of the second central device 4 located in the network control center when the systems and the communication connection enables that. In other words, the first central device 3 may act as a so called data concentrator. Naturally, if the communication connection between each of the substations and the network control center are of different quality, it would take longer to read the data from substations connected by a lower quality communication connection than from those with a communication connection with a higher capacity. The remote devices 2 typically also comprise a memory 8 that may be used for storing measurement data and/or rules for determining a phenomenon being a phenomenon of interest.

According to yet another embodiment, a data communication channel may be activated between the first central device and the second central device in response to 9-2LE or 9-2 sample stream in the first central device. The second central device may then read the sample stream data from the first central device(s) as soon as the data has been received in the first central device(s). According to a further embodiment, the first central device and/or the second control device may be configured to select between a real-time reading and delayed reading of the sample stream data and/or information about the phenomenon of interest depending on predetermined conditions that may include but are not limited to any one of the following or any combination of: the nature of the phenomenon of interest, the severity of the phenomenon of interest and the current load of the communication network.

According to an embodiment, the second central device in the network control center, for example, may be further configured to execute fault location using its own applications based on the sample stream data or other type of fault information data received from the at least one first central device and/or the at least one remote device. Alternatively or additionally, this may be applied to location of other phenomena of interest too. These embodiments may be beneficial especially when information is needed from a larger geographical area or from several substations for instance for improving the accuracy of the fault location or in connection with certain types of phenomena of interest. In other embodiments, the location of faults or other phenomena of interest may be executed by the at least one first central device or the execution of the location of fault or phenomenon of interest may divided between the first central device and the second central device. This may be beneficial especially when very fast handling of the fault or other phenomenon of interest is crucial and it enables for instance fault location during the fault or other phenomenon of interest and not only after the phenomenon.

Different types of fault location algorithms known as such and using sample stream data from one or several remote devices may be used for execution of location of fault or other phenomenon of interest in the first central device and/or second central device. There are tens or more of different fault location algorithms for different types of faults and phenomena of interest based on currents and voltages measured from one or several locations around the fault. These algorithms are known as such and, therefore, are not explained in more detail in this description.

Thus, the solutions described in this description enable both fast and efficient handling of data related to phenomena of interest in the electrical network enabling improved and real-time handling of such phenomena, such as fault location. As it is described in the embodiments, the solution may be used alone within a local electrical network, such as an electrical network controlled by one substation, or within a geographically larger area comprising several substations or even the entire electrical network of an electric company, or it may be used as a local solution providing valuable information for a more conventional central control system further handling the data using fault location algorithms known as such, for example. This solution also provides a more cost-efficient fault location method and system when compared to use of multifunction remote devices.

It will be obvious to a person skilled in the art that, as the technology advances, the inventive concept can be implemented in various ways. The invention and its embodiments are not limited to the examples described above but may vary within the scope of the claims.

The invention claimed is:

1. A method for controlling sampled measurement data stream in an electrical network comprising at least one central device and at least one remote device comprising
    measuring at least one measurement value in the remote device;
    detecting in the remote device at least one phenomenon of interest or request for a connection from the central device, wherein the phenomenon of interest is a phenomenon detectable in the electrical network that indicates a potential deviation in the operation of the electrical network or the remote device,
    activating by the remote device a 9-2LE or 9-2 communication channel for sampled measured values between the remote device and the central device in response to the detection of the phenomenon of interest or the request for a connection from the central device, wherein commands needed for activating the communication channel for sampled measured values between the remote device and the central device are provided using 8-1 GOOSE messages;
    sending the measurement value from the remote device to the central device through the communication channel for sampled measured values; and
    using GOOSE messages for suppression of not needed 9-2LE or 9-2 measurement values from remote devices by commanding stopping of sending data from the at least one remote device to the central device.

2. The method as claimed in claim 1, wherein the method further comprises
    selecting in the central device the at least one remote device to activate the communication channel for sampled measured values to the central device in response to more than one remote device of the electrical network detecting a phenomenon of interest at the same time.

3. The method as claimed in claim 2, wherein the method further comprises
    using GOOSE communication between the central device and the at least one remote device for delivering information needed for selecting the at least one remote device to activate the communication channel.

4. The method as claimed in claim 2, wherein the method further comprises:
    using GOOSE communication between the central device and the at least one remote device for delivering information needed for selecting the at least one remote device to activate the communication channel; and
    wherein the method is used for fault location in the electrical network.

5. The method as claimed in claim 1, wherein the method further comprises
    selecting between two or more remote devices the at least one remote device to activate the communication channel for sampled measured values between the remote device and the central device in response to more than one remote device of the electrical network detecting a phenomenon of interest at the same time.

6. The method as claimed in claim 5, wherein the method further comprises
    using GOOSE communication between the remote devices for delivering information needed for selecting the at least one remote device to activate the communication channel.

7. The method according to claim 1, wherein the method is used for fault location in the electrical network.

8. The method as claimed in claim 1, wherein the method further comprises
selecting in the central device the at least one remote device to activate the communication channel for sampled measured values to the central device in response to more than one remote device of the electrical network detecting a phenomenon of interest at the same time; and
wherein the method is used for fault location in the electrical network.

9. A remote device for an electrical network, wherein the remote device is configured to
measure at least one measurement value;
detect at least one phenomenon of interest, wherein the phenomenon of interest is a phenomenon detectable in the electrical network that indicates a potential deviation in the operation of the electrical network or the remote device,
activate a 9-2LE or 9-2 communication channel for sampled measured values from the remote device to a central device in response to the detection of the phenomenon of interest, wherein commands needed for activating the communication channel for sampled measured values between the remote device and the central device are provided using 8-1 GOOSE messages; and
send the measurement value from the remote device to the central device through the communication channel for sampled measured values,
wherein GOOSE messages are used for suppression of not needed 9-2LE or 9-2 measurement values from the remote device by commanding stopping of sending data from the remote device to the central device.

10. The remote device according to claim 9, wherein the remote device is configured to send, in response to detecting at least one phenomenon of interest at the remote device, information needed for selecting at least one remote device to activate the communication channel for sampled measured values between the at least one remote device and the central device to at least one of the following: at least one another remote device and the central device.

11. The remote device according to claim 10, wherein the remote device is arranged to use GOOSE communication for sending said information.

12. The remote device according to claim 10, wherein the remote device is configured to transfer information with other remote devices of the electrical network to select the at least one remote device to activate the communication channel for sampled measured values between the at least one remote device and the central device in response to several remote devices detecting a phenomenon of interest at the same time.

13. The remote device according to claim 10, wherein the remote device is configured to transfer information with the central device to select the at least one remote device to activate the communication channel for sampled measured values between the remote device and the central device in response to several remote devices detecting a phenomenon of interest at the same time.

14. The remote device according to claim 10, wherein the remote device is arranged to use GOOSE communication for sending said information; and
wherein the remote device is configured to transfer information with other remote devices of the electrical network to select the at least one remote device to activate the communication channel for sampled measured values between the at least one remote device and the central device in response to several remote devices detecting a phenomenon of interest at the same time.

15. The remote device according to claim 10, wherein the remote device is arranged to use GOOSE communication for sending said information; and
wherein the remote device is configured to transfer information with the central device to select the at least one remote device to activate the communication channel for sampled measured values between the remote device and the central device in response to several remote devices detecting a phenomenon of interest at the same time.

16. An apparatus comprising:
a system for an electrical network comprising at least one remote device and at least one central device, the remote device configured to:
measure at least one measurement value;
detect at least one phenomenon of interest, wherein the phenomenon of interest is a phenomenon detectable in the electrical network that indicates a potential deviation in the operation of the electrical network or the remote device,
activate a 9-2LE or 9-2 communication channel for sampled measured values from the remote device to the at least one central device in response to the detection of the phenomenon of interest, wherein commands needed for activating the communication channel for sampled measured values between the remote device and the at least one central device are provided using 8-1 GOOSE messages; and
send the measurement value from the remote device to the at least one central device through the communication channel for sampled measured values,
wherein GOOSE messages are used for suppression of not needed 9-2LE or 9-2 measurement values from remote devices by commanding stopping of sending data from the at least one remote device to the at least one central device; and
wherein the at least one central device is configured to receive the 9-2LE or 9-2 sample stream from the remote device.

17. The apparatus according to claim 16, wherein the at least one central device is configured to execute location of a phenomenon of interest on the basis of said 9-2LE or 9-2 sample stream.

18. The apparatus according to claim 16, wherein the at least one central device and the at least one remote device are located within the same substation.

19. The apparatus according to claim 16, wherein the system further comprises a second central device located at a network control center.

20. The apparatus according to claim 16, wherein the at least one central device is configured to execute location of a phenomenon of interest on the basis of said 9-2LE or 9-2 sample stream; and
wherein the at least one central device and the at least one remote device are located within the same substation.

21. The apparatus according to claim 16, wherein the at least one central device is configured to execute location of a phenomenon of interest on the basis of said 9-2LE or 9-2 sample stream; and
wherein the system further comprises a second central device located at a network control center.

* * * * *